US009519316B2

(12) United States Patent  
Huang

(10) Patent No.: US 9,519,316 B2  
(45) Date of Patent: Dec. 13, 2016

(54) FLASH DRIVE WITH ATTACHED COVER

(71) Applicant: HOEY CO., LTD., Taoyuan (TW)

(72) Inventor: Joseph Huang, Taoyuan (TW)

(73) Assignee: HOEY CO., LTD., Taoyuan (TW)

( * ) Notice: Subject to any disclaimer, the term of this patent is extended or adjusted under 35 U.S.C. 154(b) by 0 days.

(21) Appl. No.: 14/794,957

(22) Filed: Jul. 9, 2015

(65) Prior Publication Data

US 2016/0098066 A1    Apr. 7, 2016

(30) Foreign Application Priority Data

Oct. 1, 2014 (TW) ............... 103217454 A

(51) Int. Cl.  
  *G06F 1/16*  (2006.01)  
  *G06F 1/18*  (2006.01)

(52) U.S. Cl.  
  CPC ..................... *G06F 1/181* (2013.01)

(58) Field of Classification Search  
  CPC ....................................... G06F 1/181  
  See application file for complete search history.

(56) References Cited

U.S. PATENT DOCUMENTS

| | | | | |
|---|---|---|---|---|
| 6,926,544 B2* | 8/2005 | Lee | ...... | H01R 13/447 439/147 |
| 6,932,629 B2* | 8/2005 | Ikenoue | ...... | H05K 5/0278 439/136 |
| 7,295,431 B2* | 11/2007 | Chuang | ...... | G06K 19/07732 16/324 |
| 7,462,044 B1* | 12/2008 | Regen | ...... | H01R 13/6641 439/131 |
| 7,500,858 B2* | 3/2009 | Emerson | ...... | H01R 13/447 439/131 |
| 7,530,823 B1* | 5/2009 | Thornton | ...... | H01Q 1/2275 439/131 |
| 7,544,073 B2* | 6/2009 | Nguyen | ...... | G06K 19/07732 439/135 |
| 7,713,074 B2* | 5/2010 | Poo | ...... | H01R 13/447 439/136 |
| 8,179,670 B2* | 5/2012 | Huang | ...... | B21D 31/02 361/679.02 |
| 8,246,362 B2* | 8/2012 | Ma | ...... | H01R 13/447 361/752 |
| 8,974,238 B2* | 3/2015 | Chou | ...... | H01R 13/447 361/725 |
| 9,202,089 B2* | 12/2015 | Yang | ...... | G06K 7/0004 |
| 9,215,820 B2* | 12/2015 | Villa-Real | ...... | H05K 5/0278 |
| 2005/0079738 A1* | 4/2005 | Ahn | ...... | H01R 13/447 439/1 |
| 2010/0328874 A1* | 12/2010 | Ko | ...... | H01R 35/04 361/679.32 |

(Continued)

*Primary Examiner* — Lisa Lea Edmonds  
(74) *Attorney, Agent, or Firm* — Guice Patents PLLC

(57) ABSTRACT

A flash drive includes a housing comprising a front wall, a rear wall and an inner space formed by the front wall and the rear wall; a storage module disposed in the inner space; a plug head mounted at one end of the storage module; a positioning element positioning the storage module in the inner space of the housing in such a manner that the plug head protrudes from one end of the housing; and a cover pivoted to the front wall and the rear wall through an eccentric-rotation structure to cover or uncover the plug head.

11 Claims, 8 Drawing Sheets

(56) References Cited

U.S. PATENT DOCUMENTS

| | | | | |
|---|---|---|---|---|
| 2012/0268887 A1* | 10/2012 | Pan | ...................... | H05K 5/0278 |
| | | | | 361/679.32 |
| 2013/0107442 A1* | 5/2013 | Zhou | .................... | H01R 13/447 |
| | | | | 361/679.32 |
| 2013/0183841 A1* | 7/2013 | Stevens | ................ | H01R 13/447 |
| | | | | 439/131 |
| 2013/0217248 A1* | 8/2013 | Stevens | ................ | H01R 13/447 |
| | | | | 439/131 |
| 2016/0054763 A1* | 2/2016 | Lee | ........................ | H01R 27/00 |
| | | | | 361/679.32 |

* cited by examiner

C-C

FLASH DRIVE WITH ATTACHED COVER

BACKGROUND OF THE INVENTION

Field of the Invention

The invention relates to a flash drive with attached cover, and more particularly to a flash drive with a cover quickly covering or removing from a USB plug head.

Description of the Related Art

Flash drives are a memory for quick storing and transmitting data. The universal serial bus (USB) is often adapted to be the interface of the flash drives.

Flash drives are broadly used in many technical fields for storing and transmitting data. As the mobile phones, cameras and tablets develop, flash drives become diversified. Flash drives are required to connect USB connectors and connect to micro USB connectors. Such storage devices using USB interface are small and portable, they also develop various connection type for various electronic devices.

Flash drives includes memory units, circuit boards and housing. The circuit board is connected to a USB plug protruding from the housing. The flash drive is connected to an electronic device through the USB plug inserted into a USB socket of the electronic device. A cover is often needed for protecting the USB plug. When a flash drive is not used, the cover can shelter the USB plug. The cover must be put to the USB plug or removed from the USB plug, which is inconvenient for users, and is easy to be lost when it is removed from the USB plug and put in somewhere.

BRIEF SUMMARY OF THE INVENTION

The object of the invention is to provide a flash drive with an attached cover covering or removing from a plug head quickly and avoided to be lost when the cover is removed.

The invention provides a flash drive. The flash drive in accordance with an exemplary embodiment of the invention includes a housing comprising a front wall, a rear wall and an inner space formed by the front wall and the rear wall; a storage module disposed in the inner space; a plug head mounted at one end of the storage module; a positioning element positioning the storage module in the inner space of the housing in such a manner that the plug head protrudes from one end of the housing; and a cover pivoted to the front wall and the rear wall through an eccentric-rotation structure to cover or uncover the plug head.

In another exemplary embodiment, the eccentric-rotation structure comprises a pair of shafts opposite disposed at upper corners of the front wall and the rear wall, the cover comprises a front plate, a rear plate, a top plate and a first groove formed by the front plate, the rear plate and the top plate, the shafts fit first holes formed on the front plate and the rear plate so that the cover is pivoted to the housing.

In yet another exemplary embodiment, the flash drive further includes a pad disposed between the shaft and the hole.

In another exemplary embodiment, the cover further includes a positioning groove formed on an inner surface of the top plate.

In yet another exemplary embodiment, the housing further includes an engaging device and a positioning device, the positioning element includes a corresponding engaging device corresponding to the engaging device, and the cover includes a corresponding positioning device corresponding to the positioning device.

In another exemplary embodiment, the engaging device includes a spring sheet, and the corresponding engaging device includes a depression; the positioning device includes a protrusion, and the corresponding positioning device includes a first recess and a second recess corresponding to the eccentric-rotation structure.

In yet another exemplary embodiment, the engaging device includes an engaging hole, and the corresponding engaging device includes an inclined spring sheet.

In another exemplary embodiment, the positioning element has an inverted L shape and includes a rear plate, a front plate, a connecting plate connecting the rear plate and the front plate, a second groove formed between the rear plate and the front plate, a second hole having a shape corresponding to a cross section of the plug head, wherein the plug head protrudes from the hole.

In yet another exemplary embodiment, the front plate includes at least one protrusion.

In another exemplary embodiment, the cover includes an ear portion and a through hole formed on the ear portion.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
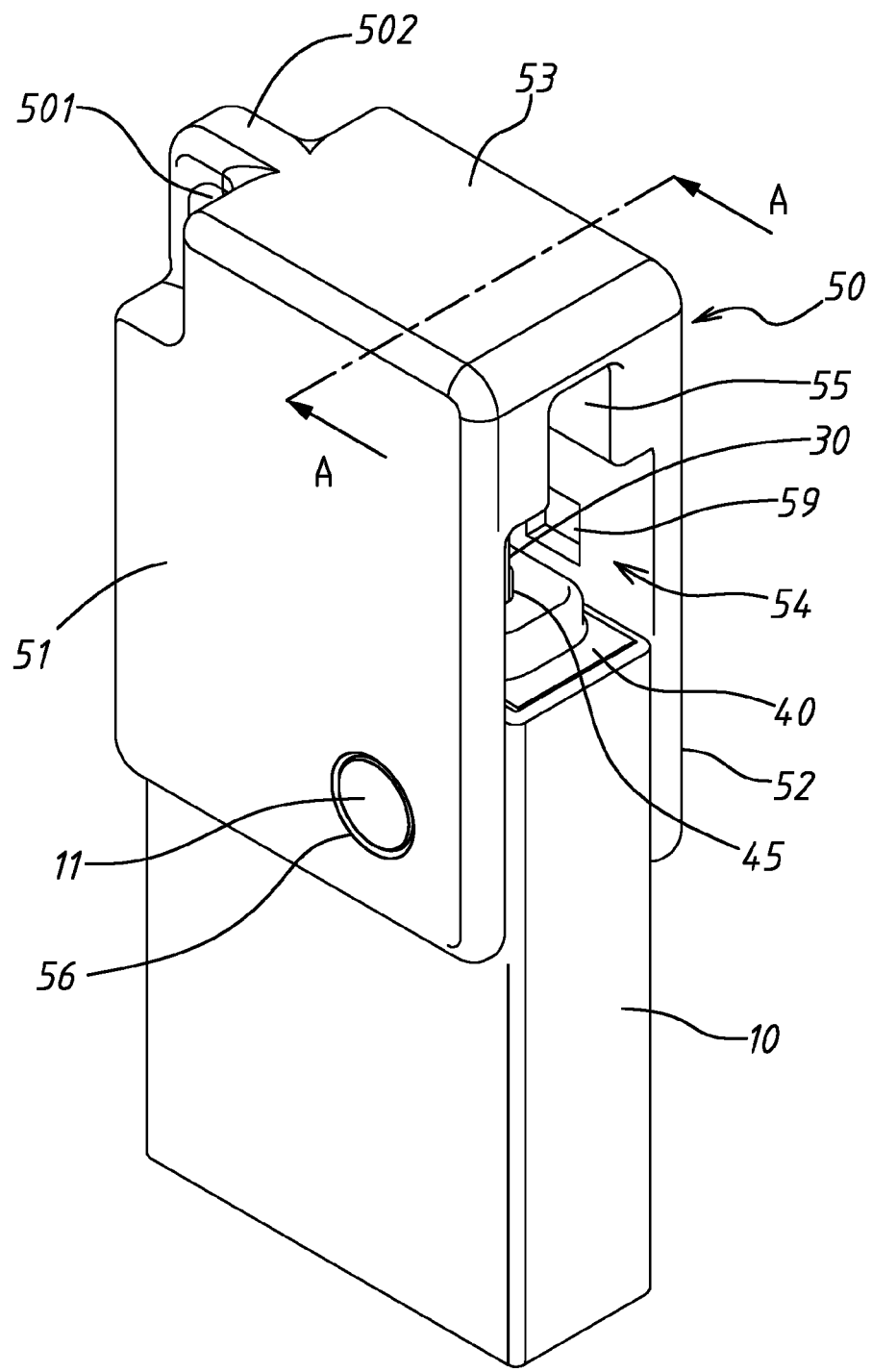
FIG. 1 is a perspective view of an embodiment of a flash drive of the invention.
Figure 2:
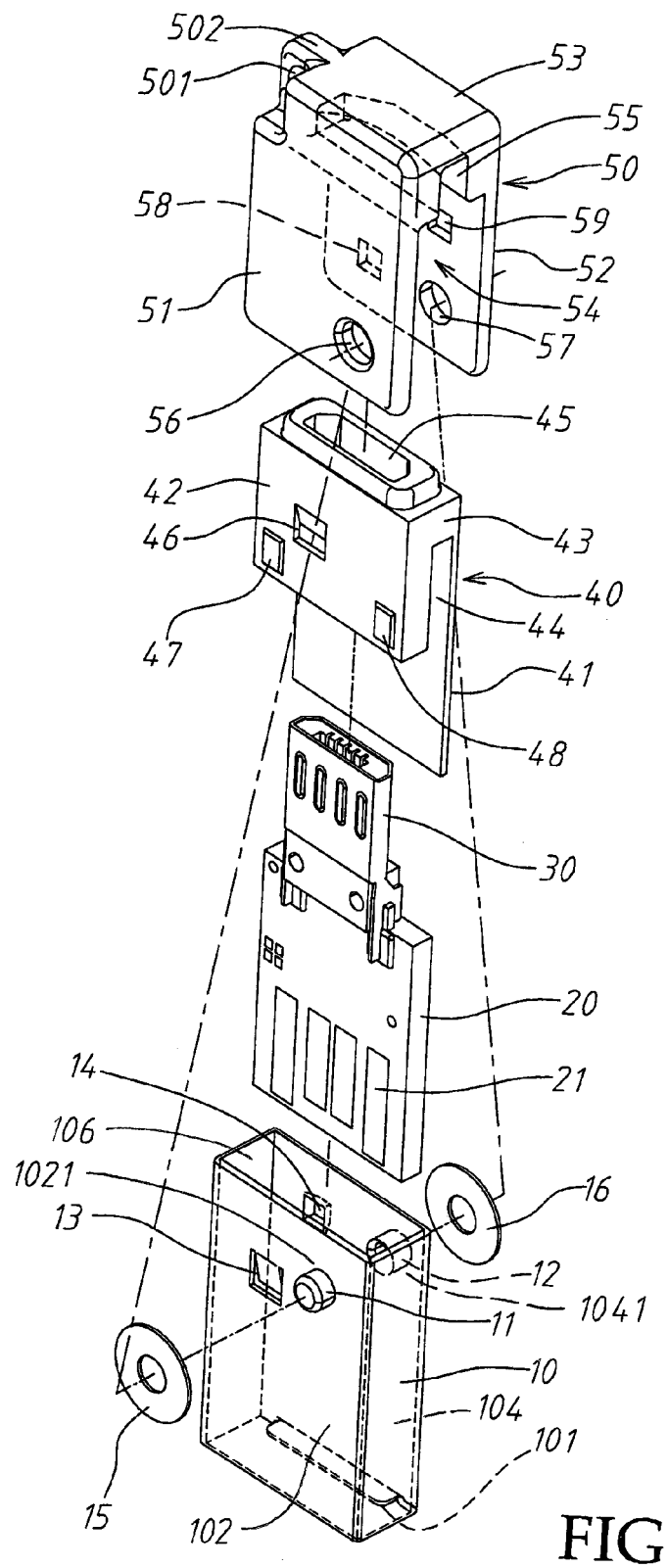
FIG. 2 is an exploded view of the embodiment of the flash drive of FIG. 1.

Referring to FIGS. 1 and 2, a flash drive includes a housing 10, a storage module 20, a plug head 30, a positioning element 40 and a cover 50. The housing 10 has an inner space 106 formed by a front wall 102 and a rear wall 104 for accommodating other elements. The storage module 20 has a metal sheet 21 at one end for connecting a plurality of metal terminals disposed on a connecting plate and a plurality of welding pads at the other end for connecting a plug head 30. The positioning element 40 positions the storage module 20 in the housing 10 and the plug head 30 protruding from one end of the housing 10 (the top wall of the housing 10). The cover 50 is eccentric-rotatablly disposed on the housing 10 to cover or uncover the plug head 30.

Referring to FIGS. 1 to 5, an eccentric-rotation structure includes two shafts 11 and 12 extending along an axis C (see FIGS. 2 and 4) and opposite disposed at upper corners 1021, 1041 of the front wall 102 and the rear wall 104 of the housing 10. An engaging device is disposed on the front wall 102, and a positioning device is disposed on the rear wall 104. In this embodiment, the engaging device is a spring sheet 13, and the positioning device is a protrusion 14. The positioning element 40 has an inverted-L shape. The positioning element 40 includes a rear plate 41, a front plate 42 and a connecting plate 43. A second groove 44 is formed between the front plate 42 and the rear plate 41 to receive the storage module 20. A second hole 45 having a shape corresponding to a cross section of the plug head 30 is formed on the connecting plate 43. The plug head 30 extends through the second hole 45 to protrude from the positioning element 40. Another corresponding engaging device corresponding to the spring sheet 13 is disposed on the rear plate 41 and the front plate 42. In this embodiment, the corresponding engaging device is a depression 46. In this embodiment, one or more protrusions 47 and 48 are disposed on the front plate 42.

Figure 2A:
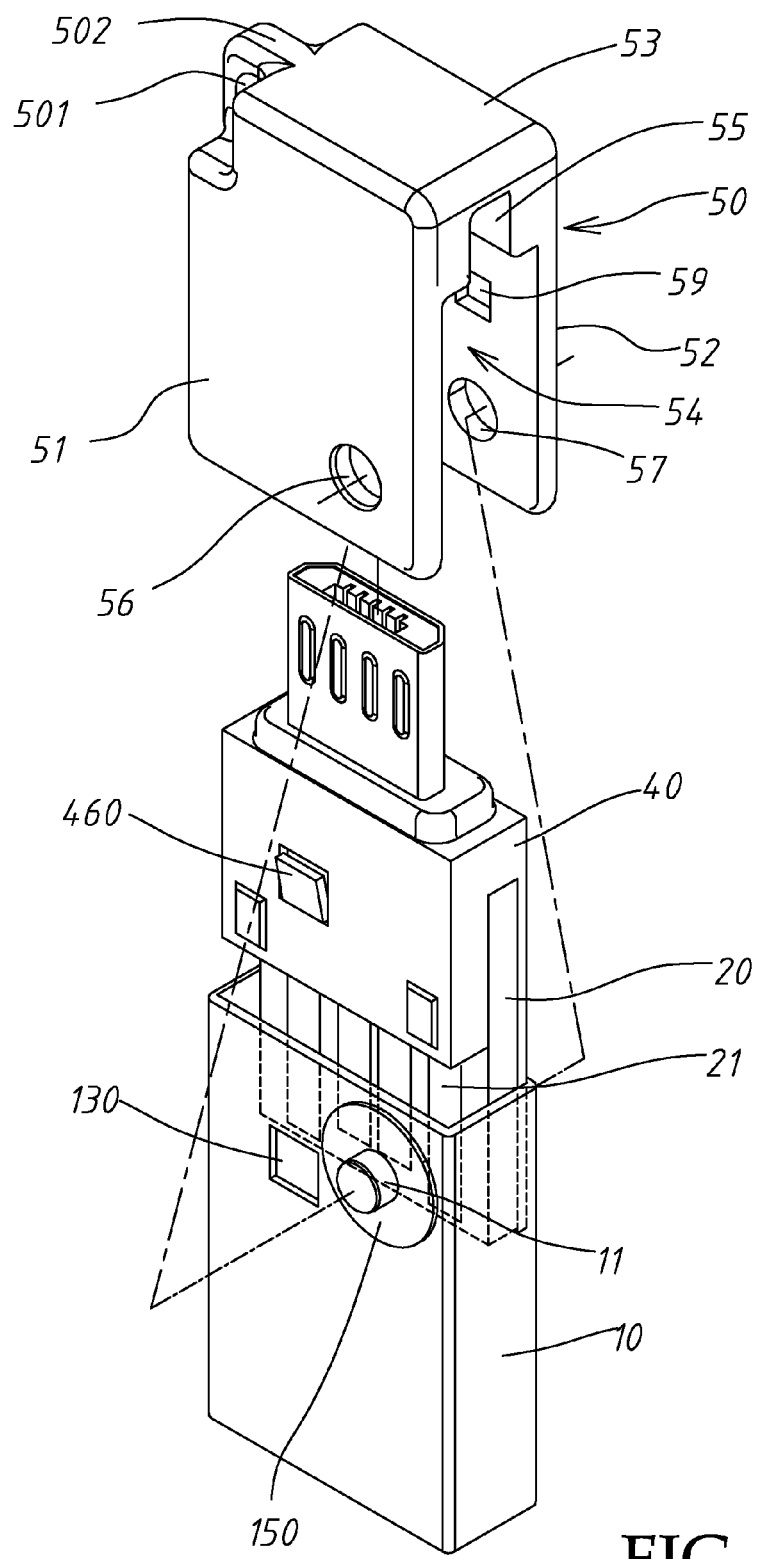
FIG. 2A depicts a housing and a positioning element engaging with the housing of FIG. 2.
Figures 3, 4:
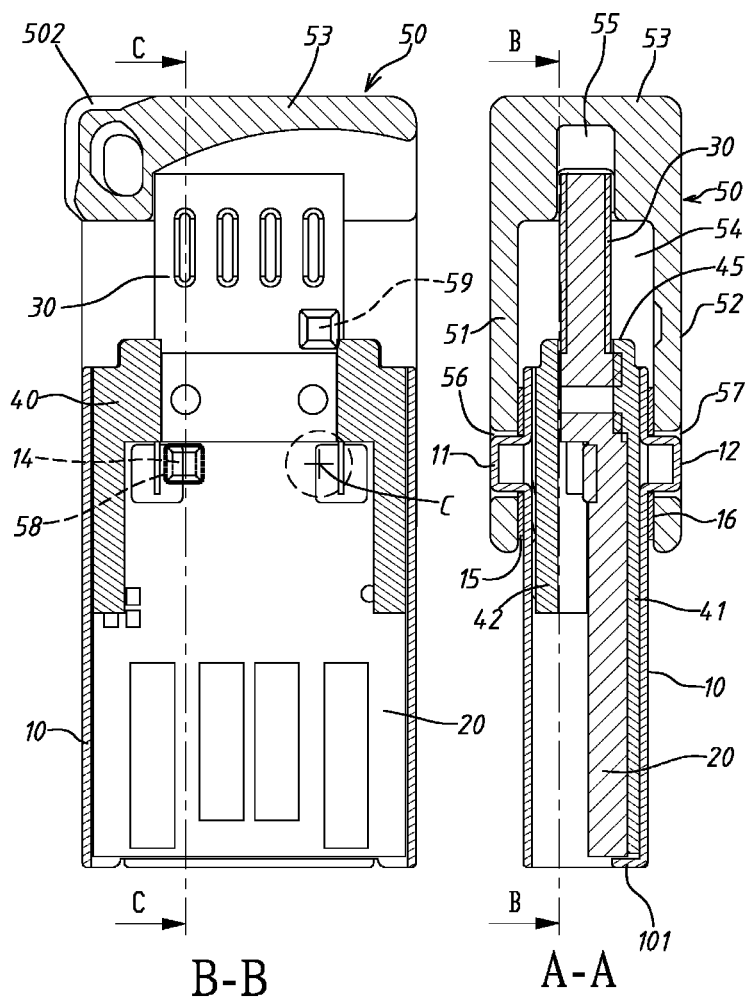
FIG. 3 is a cross section of FIG. 1 along a line A-A.
FIG. 4 is a cross section of FIG. 3 along a line B-B.
Figure 5:
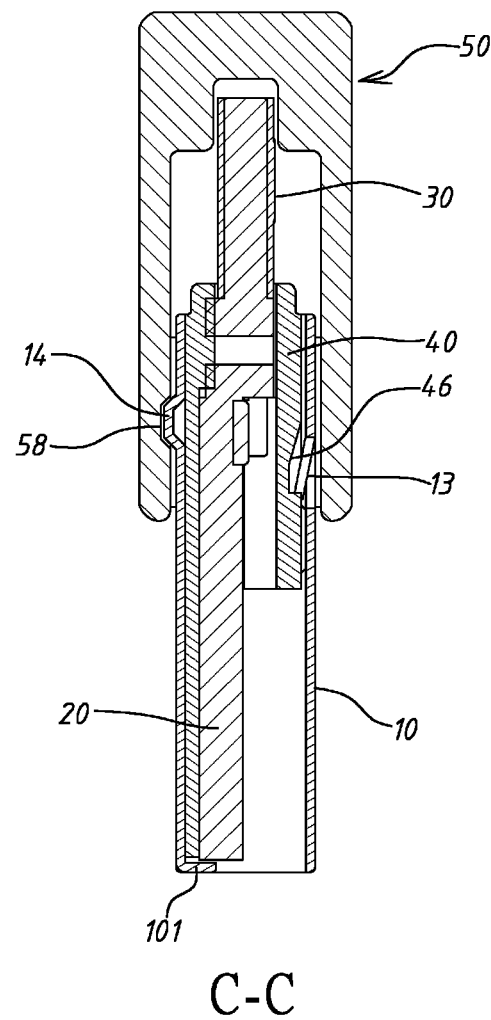
FIG. 5 is a cross section of FIG. 4 along a line C-C.

A cover 50 is disposed on an upper surface of the housing 10. The cover 50 includes a front wall 51, a rear wall 52 and a top wall 53. A first groove 54 is formed by the front wall 51, the rear wall 52 and the top wall 53. In this embodiment, a positioning groove 55 having a shape corresponding to the cross section of the plug head 30 is formed on the top wall 53. The first groove 54 and the positioning groove 55 covers the plug head 30. Two first holes 56 and 57 formed on the front wall 51 and the rear wall 52 respectively rotatably fit the shafts 11 and 12 so that the cover 50 is rotatable with respect to the housing 10. In this embodiment, a pad 15 is disposed between the shaft 11 and the first hole 56 and a pad 16 is disposed between the shaft 12 and the first hole 57 respectively. As shown in FIG. 2A, the pad 15 (only the pad 15 is shown in FIG. 2A) can be formed by punching the housing 10. An engaging hole 130 is formed on the housing 10. The positioning element 40 has an inclined spring sheet 460 corresponding to the engaging hole 130. The engaging hole 130 and the inclined spring sheet 460 are another engaging structure for the housing 10 and the positioning element 40. The cover 50 includes a corresponding positioning structure corresponding to the positioning structure of the housing 10. In this embodiment, the corresponding positioning structure includes a first depression 58 fitting the protrusion 14 of the housing 10 when the cover 50 covers the plug head 30, and a second depression 59 fitting the protrusion 14 when the cover 50 uncovers the plug head 30. In this embodiment, the cover 50 has an ear portion 502 having a through hole 501 for connecting other portable devices.

The storage module 20 and the plug head 30 are assembled to the positioning element 40, and the assembly is disposed in the housing 10 through engagement of the spring sheet 13 with the depression 46 and the protrusions 47 and 48 pressing on an inner surface of the housing 10. The cover 50 can be positioned by the first depression 58 fitting the protrusion 14 of the housing 10.

Figure 6:
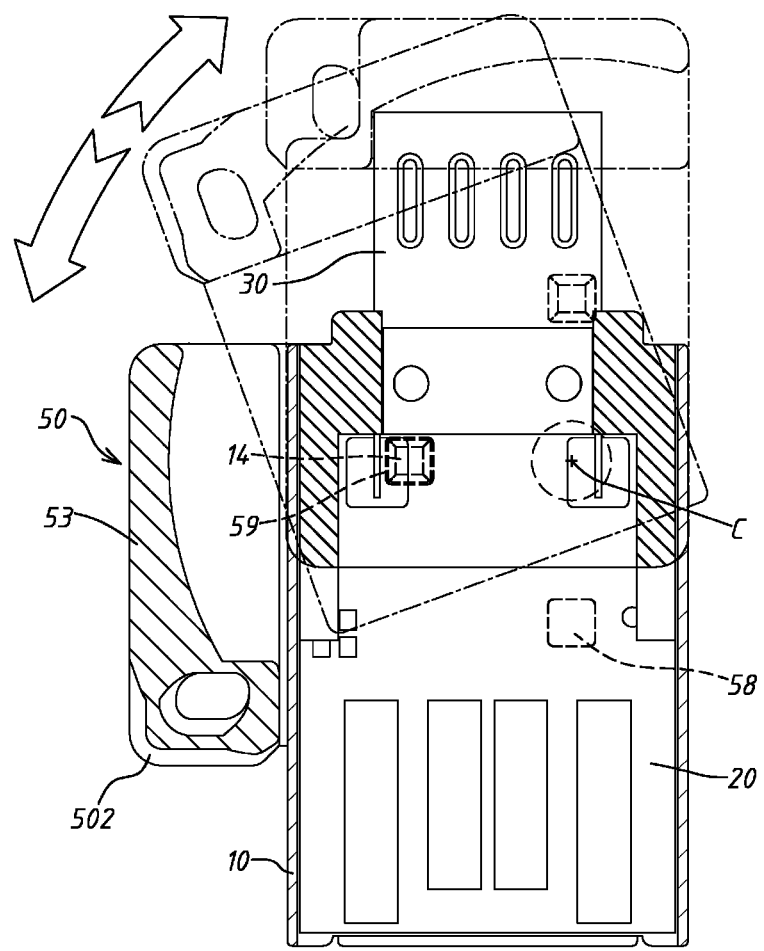
FIG. 6 depict a cover removed from a flash drive of FIG. 4.
Figure 7:
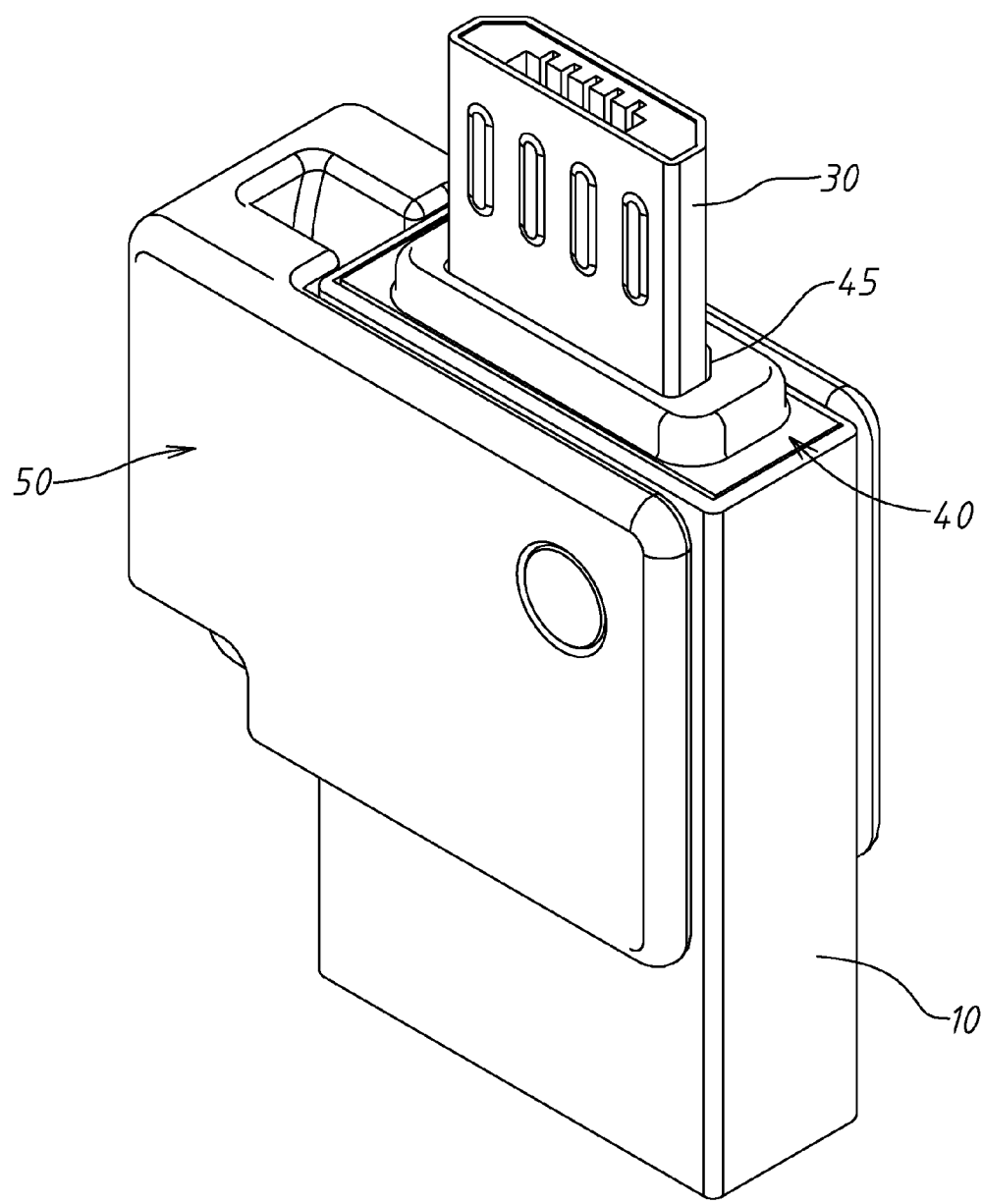
FIG. 7 is a perspective view of a flash drive of the invention, wherein a cover is removed completely.

Referring to FIG. 6, the cover 50 is rotatable through the shafts 11 and 12 rotatably fitted to the first holes 56 and 57. When the cover 50 is rotated by about 90° as shown in FIG. 6, the plug head 30 is uncovered and ready for being plugged into an electronic devices. When the cover 50 is rotated to a position shown in FIG. 7, the plug head 30 is completely uncovered, and the second depression 59 engages the protrusion 14 to position the cover 50. The cover 50 can be rotated in an opposite direction to cover the plug head 30.

Figure 8:
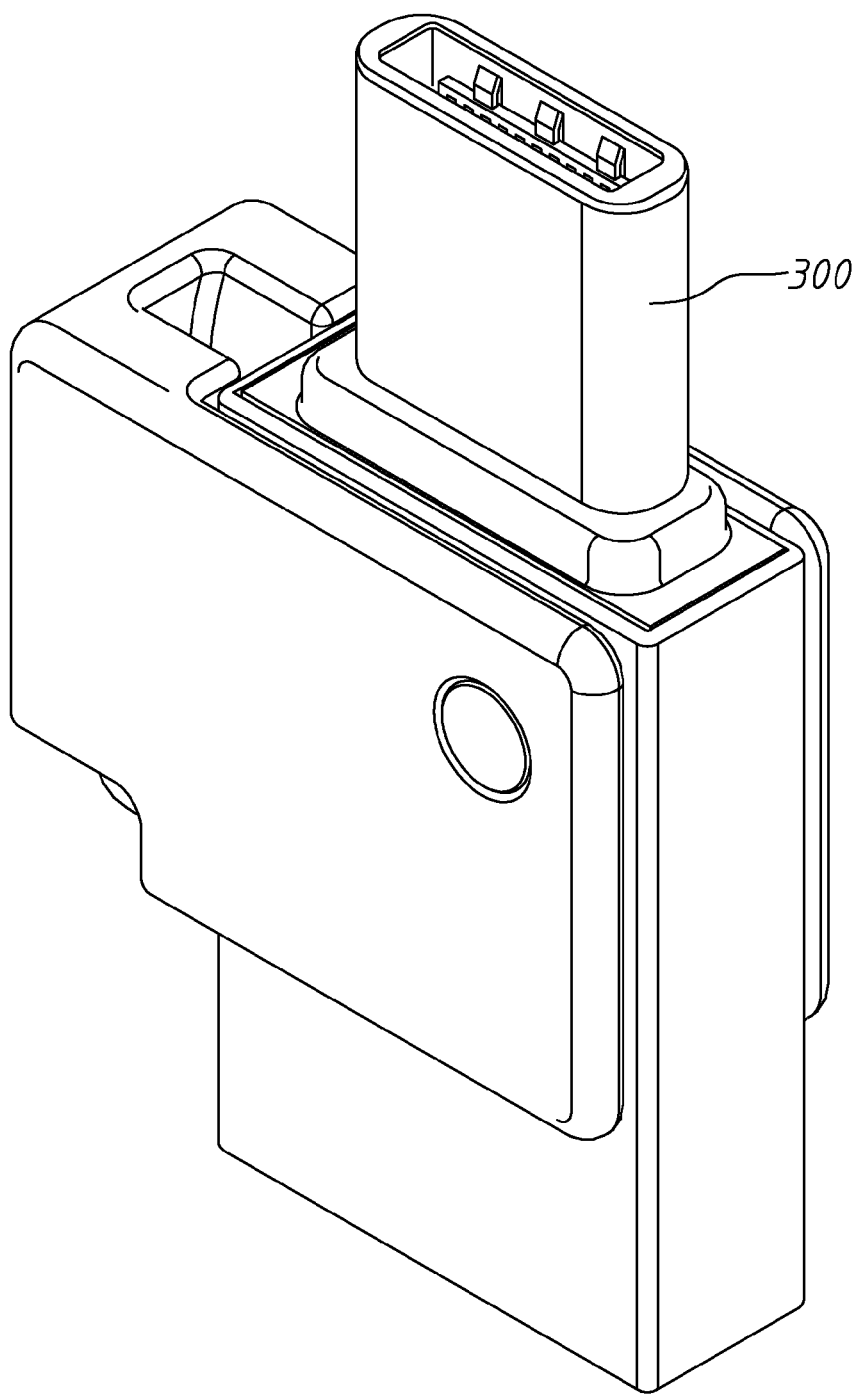
FIG. 8 depicts another embodiment of a flash drive of the invention.

Since USB-IF (USB Implementers Forum) issues a new specification of USB 3.1 regarding new micro USB which is called USB 3.1 TYPE C as shown in FIG. 8. The USB 3.1 TYPE C increases current and transmitting speed and can be connected in two opposite directions. The invention is applied to the plug 300 of USB 3.1 TYPE C.

The flash drive of the invention has an attached cover to quickly cover or uncover the plug head. Since the cover is attached to the housing, the cover is prevented to be lost.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flash drive with attached cover, comprising:
   a housing comprising a front wall, a rear wall and an inner space formed by the front wall and the rear wall;
   a storage module disposed in the inner space;
   a plug head mounted at one end of the storage module;
   a positioning element positioning the storage module in the inner space of the housing in such a manner that the plug head protrudes from one end of the housing; and
   a cover pivoted to the front wall and the rear wall through an eccentric-rotation structure to cover or uncover the plug head;
   wherein the eccentric-rotation structure comprises a pair of shafts opposite disposed at upper corners of the front wall and the rear wall, the cover comprises a front plate, a rear plate, a top plate and a first groove formed by the front plate, the rear plate and the top plate, the shafts fit first holes formed on the front plate and the rear plate so that the cover is pivoted to the housing.

2. The flash drive as claimed in claim 1, further comprising a pad disposed between the shaft and the hole.

3. The flash drive as claimed in claim 1, wherein the cover further comprises a positioning groove formed on an inner surface of the top plate.

4. The flash drive as claimed in claim 1, wherein the cover comprises an ear portion and a through hole formed on the ear portion.

5. A flash drive with attached cover, comprising:
   a housing comprising a front wall, a rear wall and an inner space formed by the front wall and the rear wall;
   a storage module disposed in the inner space;
   a plug head mounted at one end of the storage module;
   a positioning element positioning the storage module in the inner space of the housing in such a manner that the plug head protrudes from one end of the housing; and
   a cover pivoted to the front wall and the rear wall through an eccentric-rotation structure to cover or uncover the plug head;
   wherein the housing further comprises an engaging device disposed on the front wall and a positioning device disposed on the rear wall, the positioning element comprises a corresponding engaging device corresponding to the engaging device, and the cover comprises a corresponding positioning device corresponding to the positioning device.

6. The flash drive as claimed in claim 5, wherein the engaging device comprises a spring sheet, and the corresponding engaging device comprises a depression; the positioning device comprises a protrusion, and the corresponding positioning device comprises a first recess and a second recess corresponding to the eccentric-rotation structure.

7. The flash drive as claimed in claim 5, wherein the engaging device comprises an engaging hole, and the corresponding engaging device comprises an inclined spring sheet.

8. The flash drive as claimed in claim 5, wherein the cover comprises an ear portion and a through hole formed on the ear portion.

9. A flash drive with attached cover, comprising:
   a housing comprising a front wall, a rear wall and an inner space formed by the front wall and the rear wall;
   a storage module disposed in the inner space;
   a plug head mounted at one end of the storage module;
   a positioning element positioning the storage module in the inner space of the housing in such a manner that the plug head protrudes from one end of the housing; and
   a cover pivoted to the front wall and the rear wall through an eccentric-rotation structure to cover or uncover the plug head;
   wherein the positioning element has an inverted L shape and comprises a rear plate, a front plate, a connecting plate connecting the rear plate and the front plate, a second groove formed between the rear plate and the front plate, a second hole having a shape corresponding to a cross section of the plug head and formed on the connecting plate, wherein the plug head protrudes from the hole.

10. The flash drive as claimed in claim 9, wherein the front plate comprises at least one protrusion.

11. The flash drive as claimed in claim 9, wherein the cover comprises an ear portion and a through hole formed on the ear portion.

* * * * *